United States Patent [19]

Petted et al.

[11] Patent Number: 5,153,469
[45] Date of Patent: Oct. 6, 1992

[54] BIASING NETWORK FOR USE WITH FIELD EFFECT TRANSISTOR RING MIXER

[75] Inventors: Brian E. Petted, Cedar Rapids, Iowa; Jeffrey P. Ortiz, Chandler, Ariz.; Leo J. Wilz, Cedar Rapids, Iowa; Robert J. Baeten, Chandler, Ariz.

[73] Assignee: Rockwell International Corporation, Seal Beach, Calif.

[21] Appl. No.: 691,267

[22] Filed: Apr. 25, 1991

[51] Int. Cl.$^5$ .................... H03K 3/01; H03K 17/687
[52] U.S. Cl. .................... 307/529; 307/571; 307/296.1; 307/296.4; 307/296.6; 307/296.8; 455/326
[58] Field of Search ........... 307/571, 529, 296.1, 307/296.4, 296.6, 296.8; 455/326

[56] References Cited

U.S. PATENT DOCUMENTS 4,712,024 12/1987 McGuire et al. .................... 307/529
4,823,029 4/1989 Gabara .................... 307/296.1
4,829,204 5/1989 Harris, Jr. et al. .................... 307/529

Primary Examiner—Stanley D. Miller
Assistant Examiner—Margaret Rose Wambach
Attorney, Agent, or Firm—John J. Horn; M. Lee Murrah; H. Frederick Hamann

[57] ABSTRACT

A biasing network for use in conjunction with a mixer employing field effect transistors which provides for minimum conversion loss over a range of process and temperature conditions. The biasing circuit includes a first field effect transistor having a small gate periphery which is configured as a current source, a second or reference field effect transistor having a gate periphery substantially equal to the gate peripheries of the transistors in the mixer to which the biasing circuit is providing DC biasing voltages and a voltage divider which is functional in defining operating conditions for the reference transistor.

7 Claims, 3 Drawing Sheets

BIASING NETWORK FOR USE WITH FIELD EFFECT TRANSISTOR RING MIXER

BACKGROUND OF THE INVENTION

The present invention relates to field effect transistors and more specifically to biasing circuits for use in conjunction with mixers which utilize field effect transistors.

Mixers which use field effect transistors in radio frequency applications are subject to conversion loss problems which are a function of temperature and process conditions. As shown in FIG. 4 by curves 5 and 7 representing different local oscillator power levels, changes in the gate bias voltage which commonly occur as a result of temperature and process variations have a substantial effect on the amount of conversion loss in the mixer and seriously limit mixer performance. Minimum conversion loss is achieved when the field effect transistors are biased at or near their threshold or pinchoff voltages. However, since the threshhold voltage which is characteristic of a particular field effect transistor changes as a function of temperature and process conditions it is desirable to provide some form of dynamic biasing which responds to such changes in order to maintain bias levels in proximity to threshhold voltages.

It is therefore an object of the present invention to provide a biasing circuit for use with field effect transistors which dynamically biases the transistors in response to process and temperature changes.

It is a further object of the present invention to provide a field effect transistor ring mixer having a biasing circuit which responds to process and temperature changes to maintain the bias level at or near the threshhold voltages for the transistors in the mixer.

It is further object of the present invention to provide a biasing circuit for a radio frequency mixer employing field effect transistors which provides minimum conversion loss over a range of temperature and process conditions.

SUMMARY OF THE INVENTION

The present invention constitutes a biasing network or circuit for use in conjunction with a radio frequency mixer employing field effect transistors which provides for minimum conversion loss over a range of process and temperature conditions. The biasing circuit includes a first field effect transistor having a small gate periphery, or channel width, compared to the gate peripheries of the transistors in the mixer which are actually used in performing the mixing functions and a second or "reference" field effect transistor having a gate periphery substantially equal to the gate peripheries of the transistors in the mixer which are used in performing the mixing functions. The first field effect transistor is configured as a current source providing a limited amount of current to the second field effect transistor. The second field effect transistor is interconnected with a voltage divider which helps define its operating conditions. The gate of the second field effect transistor is coupled to the gates of the field effect transistors in the mixer for providing the required DC biasing to these transistors.

In operation, the first field effect transistor provides only a small amount of current to the second field effect transistor for controlling its operating conditions and setting the gate to source voltage of the second or reference field effect transistor in proximity to its threshhold voltage. A DC biasing voltages are thereby generated near the threshhold voltage for the similar field effect transistors in the mixer which is supplied to these transistors for maintaining optimum conversion loss conditions. In the preferred embodiment, the biasing network and mixer and implemented on a single integrated circuit chip with the mixer constituting a ring mixer comprised of four interconnected field effect transistors.

DESCRIPTION OF THE PREFERRED EMBODIMENT

Figure 1:
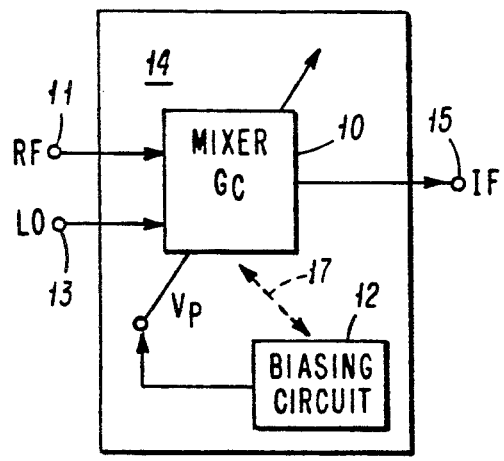
FIG. 1 provides a block diagram showing a biasing circuit in accordance with the present invention implemented on a single integrated circuit chip with a mixer employing field effect transistors to which the biasing circuit provides a DC biasing voltage.

Referring now to FIG. 1, the present invention comprises a biasing network or circuit 12 which is specifically designed for use in conjunction with field effect transistors (or "FETs") which are utilized as components in a mixer 10. The mixer 10 receives a radio frequency signal at terminal 11 and a local oscillator signal at terminal 13 as inputs and combines these signals to provide an intermediate frequency output signal at terminal 15. The biasing circuit 12 insures that proper DC operating conditions are maintained for the field effect transistors making up the mixer 10. The biasing circuit 12 adjusts biasing levels to correct for temperature and process perturbations in order to maintain the gain $G_C$ of the mixer 10 at optimum levels. As intended to be shown by the dashed line 17 the biasing circuit 12 and mixer 10 are linked in that the biasing circuit 12 senses and corrects for changes in temperature and process conditions affecting the mixer 10. The biasing circuit 12 and mixer 10 are implemented on a single monolithic circuit chip 14 with the biasing circuit 12 and mixer 10 being positioned close enough together (e.g. within 1000 microns) to be affected by the same temperature and process conditions.

Figure 2:
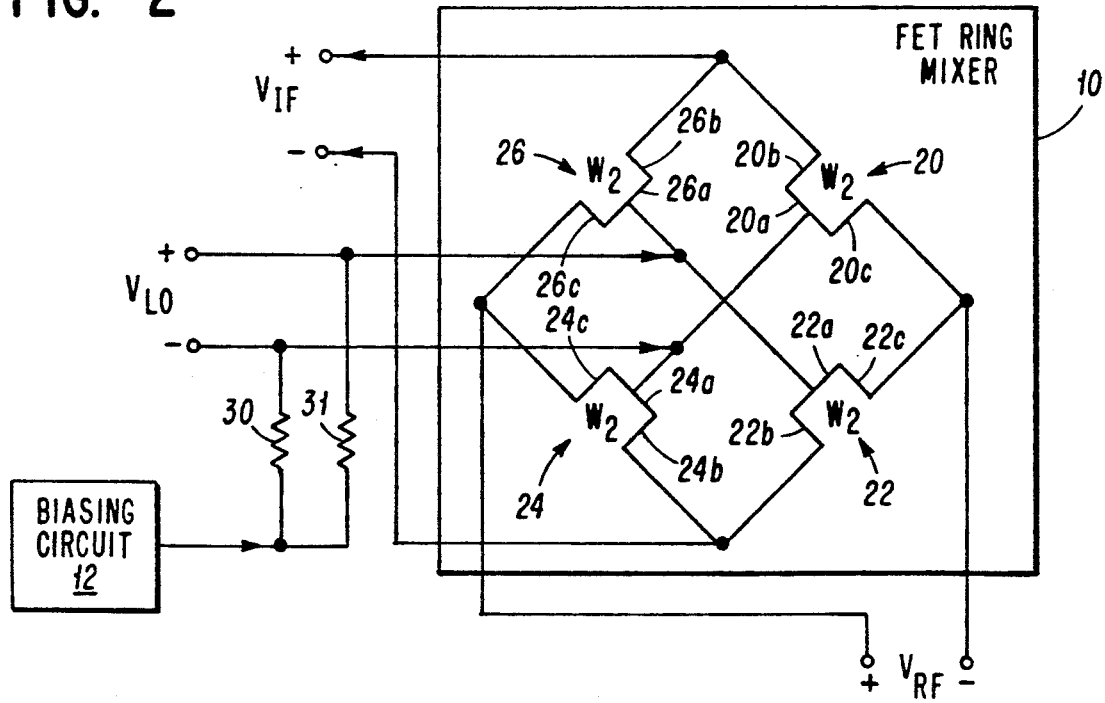
FIG. 2 provides a schematic diagram of a ring mixer employing field effect transistors for which the biasing circuit of the preferred embodiment of the present invention is specially designed for providing a DC biasing voltage.
Figure 4:
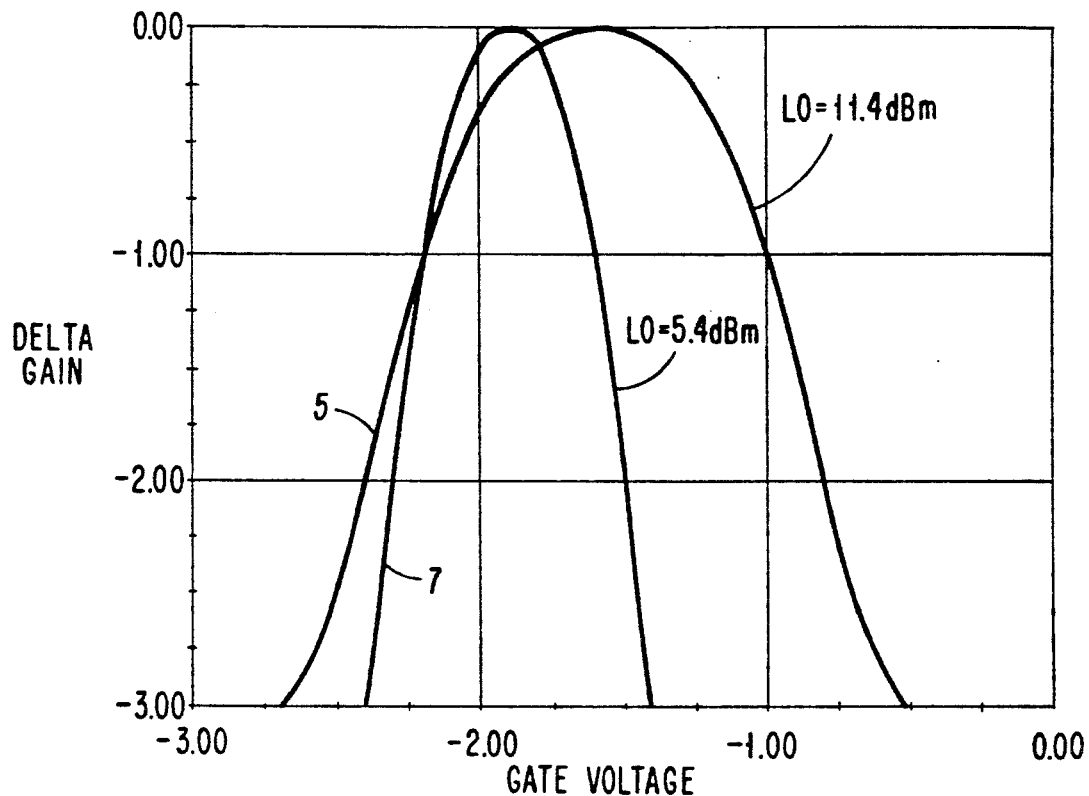
FIG. 4 provides a graph of changes in gain as a function of gate voltage at different local oscillator ("LO") power levels for a typical field effect transistor of the type which might be used in a ring mixer.

Referring now to FIG. 2, design details are shown for a FET ring mixer 10 employing four interconnected field effect transistors 20, 22, 24 and 26 which perform mixing operations. The transistors 20, 22, 24 and 26 are connected together in a ring structure whereby the gates of oppositely positioned transistors are connected together and the sources and drains of adjacent transistors are connected together. The gates 20A and 24A of the transistors 20 and 24 are connected together as well as the gates 22A and 26A of the transistors 22 and 26. The sources 20C and 22C of the transistors 20 and 22 are connected together as well as the sources 24C and 26C of the transistors 24 and 26. The drains 22B and 24B of the transistors 22 and 24 are connected together as well as the drains 20B and 26B of the transistors 20 and 26. The biasing circuit 12 is connected to the gates 20A, 22A, 24A and 26A of the transistors 20, 22, 24 and 26 by way of the resistors 30 and 32 which isolate the biasing circuit 12 from the FET ring mixer 10.

Figure 3:
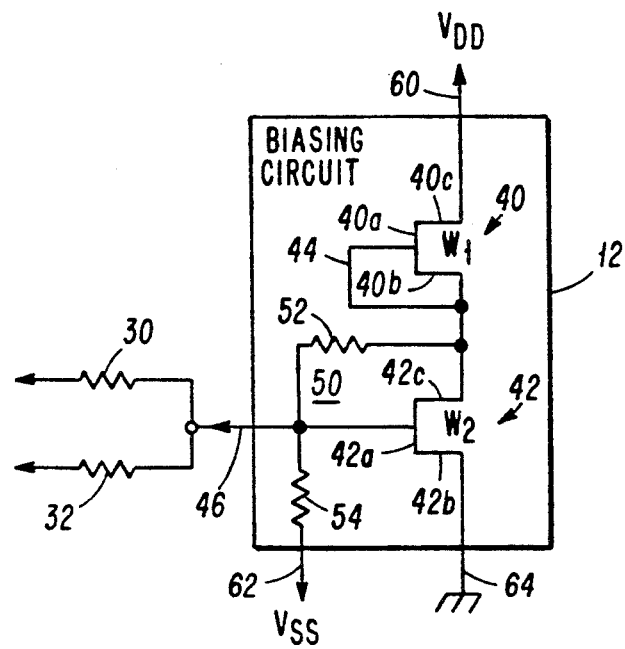
FIG. 3 provides a schematic of a biasing circuit in accordance with the present invention showing the details of the circuit components making up the present invention and their interconnections.

Referring now to FIG. 3, the biasing network or circuit 12 comprises a pair of field effect transistors 40 and 42 which are coupled together so that the current supplied by the transistor 40 effectively controls the operation of the transistor 42. The field effect transistor 42 is of identical or very similar construction to the field effect transistors 20, 22, 24 and 26 making up the ring mixer 10. The field effect transistor 40 is also of identical or very similar construction to the transistors 20, 22, 24 and 26 making up the ring mixer 10 except that the transistor 40 has a very small gate periphery as compared to the transistors making up the ring mixer. For example, the gate peripheries, or channel width, of the transistors 20, 22, 24 and 26 might typically be in the range of 150 to 200 microns while the gate periphery of the transistor 40 would typically be on the order of 5 to 10 microns. The drain 40C of the transistor 40 is connected to a voltage source providing a voltage $V_{DD}$ at terminal 60. The gate 40A of the transistor 40 is directly connected by the line 44 to its source 40B so as to configure this transistor for operation as a current source. The source 40B of the transistor 40 is also connected to the drain 42C of the transistor 42 while the source of 42B of the transistor 42 is connected to ground at terminal 64. The gate 42A of the transistor 42 is connected by way of the line 46 to the resistors 30 and 32 which interface the circuit to the ring mixer 10. A voltage divider 50 is interconnected between the drain 42C and the gate 42A of the transistor 42 and a voltage source providing a voltage $V_{ss}$ at terminal 62. More specifically, the resistor 52 of the voltage divider 50 is connected between the drain 42C and the gate 42A of the transistor 42 while the resistor 54 is connected between the gate 42A and the terminal 62. The resistors 52 and 54 are selected to provide a voltage drop of approximately $V_{DD}/2$ at the drain 42C of the transistor 42 and are of sufficiently large value to prevent any significant amounts of current from being diverted away from the transistor 42. The resistors 52 and 54 of the voltage divider 50 are sized with respect to each other so as to bias the gate 42A of the transistor 42 slightly above but in close proximity to the threshhold (or pinch-off) voltage for the transistor 42 under nominal operating conditions. Typical values for the resistors 52 and 54 might be 13 K and 10 K ohms, respectively. In operation, the voltage divider 50 couples the drain to source voltage $V_{DS}$ of the transistor 42 to its gate to source voltage $V_{GS}$ thereby providing for dynamic biasing in accordance with the operating point of the transistor.

Figure 5:
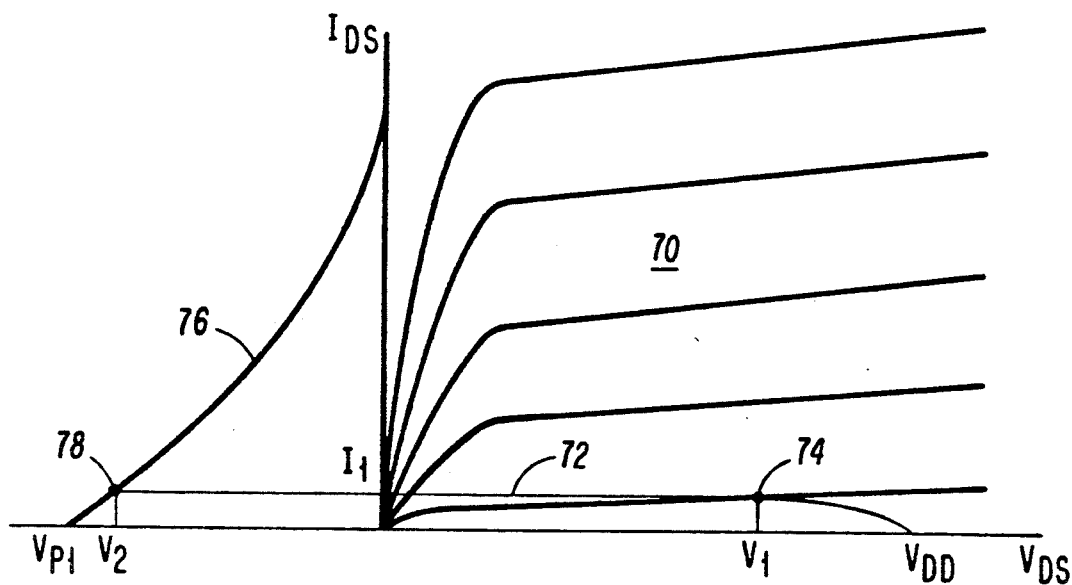
FIG. 5 provides a graph of the characteristic curves and transfer curve of a typical field effect transistor and includes a load line of a second transistor configured as a current source for setting the operating points and operative voltage levels of the first transistor.

Referring now to FIG. 5, the curves 70 represent characteristic curves for the field effect transistor 42 while the curve 76 represents the corresponding transfer curve for this device. The line 72 corresponds to the load line of the transistor 42 as defined by the transistor 40 operating as a current source with the point 74 representing a nominal operating point determining a drain to source voltage $V_1$ for the transistor 42. The operating point 74 also determines a drain to source current $I_1$ for the transistor 42 which in turn corresponds to a point 78 on the transfer curve 76 determining a gate to source voltage $V_2$ for the transistor 42. The gate to source voltage $V_2$ corresponds to the desired DC bias voltage (in proximity to the threshold voltage $V_{P1}$) which is supplied onto the gates of the transistors 20, 22, 24 and 26 of the FET ring mixer 10 by way of the resistors 30 and 32.

In operation, as process and temperature variations perturb the nominal drain currents of both the transistors 40 and 42 the ratio of the drain current perturbations in these transistors is proportional to their gate peripheries. Since the transistor 40 functions as a current source and defines the operating conditions for the transistor 42, the fact that the current perturbations are not equal causes a change in $V_{DS}$ of the transistor 42 and a corresponding change in $I_{DS}$ which leads to the establishment of a new operating point on the transfer curve for the transistor 42 which is always in proximity to the threshhold voltage for the device. The biasing circuit 12 acts to set a relative location for the operating point on the transfer curve of the transistor 42 which is maintained proportionately in proximity t the threshhold voltage despite process and temperature variations. The biasing circuit 12 thereby provides a bias level which is dynamically variable resulting in optimum conversion loss levels that are more consistent over process and temperature variations.

Figure 6:
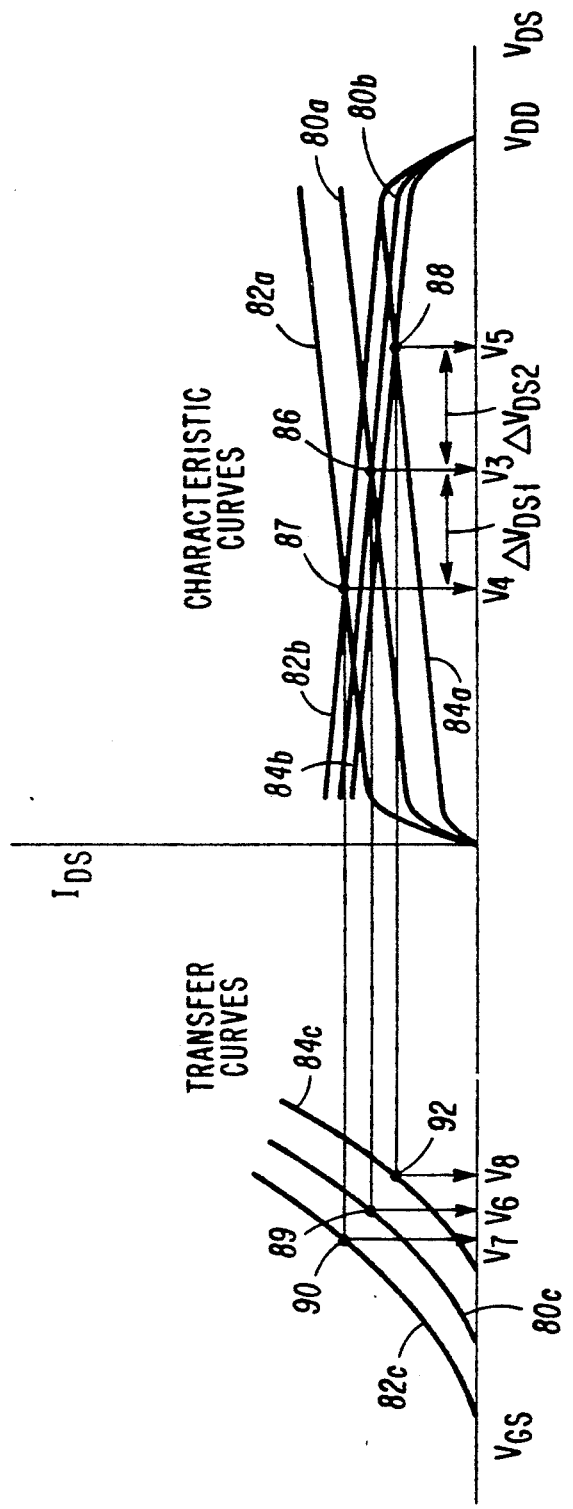
FIG. 6 provides a graph showing characteristic curves and transfer curves for a typical "reference" field effect transistor in which load lines, operating points and operative voltages are shown for three different sets of process and temperature conditions in accordance with the principles of the present invention.

Referring now to FIG. 6, the operation of the biasing circuit 12 is illustrated in greater detail under three different sets of operating conditions. The curves 80A, 80B and 80C represent operating characteristics for the device 42 under nominal operating conditions. The curves 82A, 82B and 82C correspond to conditions under which drain to source currents have been perturbed to increase. The curves 84A, 84B and 84C correspond to conditions under which drain to source currents have perturbed to decrease. Different operating points 86-92 are established for each set of operating conditions in accordance with the process and temperature perturbations affecting the devices resulting in different drain to source voltages $V_3-V_5$ and corresponding gate to source voltages $V_6-V_8$. However, due to the ratio between the gate peripheries of the transistors 40 and 42, the operating points vary in such a way as to shift the drain to source voltages by amounts $\Delta V_{DS1}$ and $\Delta V_{DS2}$ so as to determine gate to source voltages $V_6$, $V_7$ and $V_8$ which are always proportionately in proximity to the threshhold voltages for the transistors regardless of operating conditions. The dynamic interaction between the field effect transistor 40 operating as a current source, the field effect transistor 42 functioning as a "reference" device and the voltage divider 50 maintains the operating point on the transfer curve of the device 42 in relative proximity to the threshhold voltage for this transistor and the transistors 20, 22, 24 and 26 regardless of the process and temperature conditions. Conversion loss is thereby more consistently maintained at optimum levels over the range of expected process and temperature conditions.

While particular embodiments of the present invention have been shown and described, it should be clear that changes and modifications may be made to such embodiments without departing from the true scope and spirit of the invention. It is intended that the appended claims cover all such changes and modifications.

We claim:

1. A biasing network for use in conjunction with a monolithic field effect transistor ring mixer including a plurality of field effect transistors having source terminals, drain terminals, gate terminals and equal gate channel widths, said biasing network comprising:
   a first field effect transistor configured as a current source and having a small gate channel width compared to the channel widths of the gates of the field effect transistors in said ring mixer;
   a second field effect transistor having a gate channel width substantially equal to the gate channel widths of the field effect transistors in said ring mixer and which is connected to the source terminal of said first field effect transistor at its drain terminal and connected at its gate terminal to the gate terminals of the field effect transistors in said ring mixer; and
   a voltage divider for biasing the gate of said second field effect transistor which is coupled to said source terminal of said first field effect transistor, the gate terminal of said second field effect transistor and a negative supply terminal 2. The biasing network of claim 1, wherein said first field effect transistor is configured as a current source by having its source terminal connected directly to its gate terminal.

3. The biasing network of claim 1, wherein said biasing network and said ring mixer are implemented on a single integrated circuit chip.

4. The biasing network of claim 1, wherein the gate channel width of said first field effect transistor is approximately 5 microns and the gate channel width of said second field effect transistor is approximately 200 microns.

5. A ring mixer circuit of field effect transistors each field effect transistor having a source, a drain and a gate terminal comprising:
   a first, a second, a third and a fourth field effect transistor connected into a ring structure by having field effect transistors at adjacent positions coupled source terminal to source terminal and drain terminal to drain terminal and having nonadjacent field effect transistors coupled gate terminal to gate terminal;
   means for maintaining a DC biasing voltage on the gate terminals of said first, second, and third field effect transistors in close proximity to the pinch-off voltages of said first, second, third and fourth field effect transistors despite variations in temperature or process condition wherein said means for maintaining a DC biasing voltage includes a sixth field effect transistor configured as a current source, a seventh field effect transistor having its drain terminals connected to the source terminal of said sixth field effect transistor and a voltage divider coupled to said source terminal of said sixth field effect transistor, the gate terminal of said seventh field effect transistor and ground.

6. The field effect transistor ring mixer of claim 5, wherein said sixth field effect transistor has a small gate channel width compared to said first, second, third and fourth field effect transistors and said seventh field effect transistor has a gate channel width substantially equal to said first, second, third and fourth field effect transistors.

7. The field effect transistor ring mixer of claim 5, wherein said first, second, third and fourth field effect transistors and said means for maintaining a DC biasing voltage are implemented on a single circuit chip.

* * * * *